(12) United States Patent
Kim et al.

(10) Patent No.: US 12,315,860 B2
(45) Date of Patent: May 27, 2025

(54) INTEGRATED CIRCUIT PACKAGE FOR HIGH BANDWIDTH MEMORY

(71) Applicant: Google LLC, Mountain View, CA (US)

(72) Inventors: Nam Hoon Kim, San Jose, CA (US); Woon-Seong Kwon, Santa Clara, CA (US); Teckgyu Kang, Saratoga, CA (US); Yujeong Shim, Cupertino, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/624,411

(22) Filed: Apr. 2, 2024

(65) Prior Publication Data
US 2024/0250082 A1    Jul. 25, 2024

Related U.S. Application Data

(63) Continuation of application No. 17/970,237, filed on Oct. 20, 2022, now Pat. No. 11,990,461, which is a
(Continued)

(51) Int. Cl.
*H01L 25/18* (2023.01)
*H01L 23/498* (2006.01)
(Continued)

(52) U.S. Cl.
CPC ........ *H01L 25/18* (2013.01); *H01L 23/49822* (2013.01); *H01L 23/49838* (2013.01); *H01L 25/0652* (2013.01); *H01L 25/50* (2013.01); *H01L 2225/06513* (2013.01); *H01L 2225/06541* (2013.01)

(58) Field of Classification Search
CPC ............... H01L 25/18; H01L 23/49822; H01L 23/49838; H01L 25/50
See application file for complete search history.

(56) References Cited

U.S. PATENT DOCUMENTS 11,183,446 B1    11/2021  Yeon et al.
2005/0251777 A1  11/2005  Bartley et al.
(Continued)

FOREIGN PATENT DOCUMENTS

CN    109564914 A    4/2019

OTHER PUBLICATIONS

Cho et al. Design Optimization of High Bandwidth Memory (HBM) Interposer Considering Signal Integrity. Dec. 14, 2015. 2015 IEEE Electrical Design of Advanced Packaging and Systems Symposium (EDAPS), IEEE, pp. 15-18, DOI: 10.1109/EDAPS.2015.7383697.
(Continued)

*Primary Examiner* — Thao P Le
(74) *Attorney, Agent, or Firm* — Lerner David LLP (57) ABSTRACT

An integrated circuit package including a substrate configured to receive one or more high-bandwidth memory (HBM) stacks on the substrate, an interposer positioned on the substrate and configured to receive a logic die on the interposer, a plurality of interposer channels formed in the interposer and connecting the logic die to the one or more HBM stacks, and a plurality of substrate traces formed in the substrate and configured to interface the plurality of interposer channels to the one or more HBM stacks.

20 Claims, 8 Drawing Sheets

Related U.S. Application Data continuation of application No. 17/157,278, filed on Jan. 25, 2021, now Pat. No. 11,488,944.

(51) Int. Cl.
  *H01L 25/00* (2006.01)
  *H01L 25/065* (2023.01)

(56) References Cited

U.S. PATENT DOCUMENTS

| | | | |
|---|---|---|---|
| 2015/0001717 A1* | 1/2015 | Karhade | H01L 24/17 257/741 |
| 2015/0091179 A1 | 4/2015 | Shenoy et al. | |
| 2018/0047663 A1 | 2/2018 | Camarota | |
| 2018/0130736 A1 | 5/2018 | Buvid et al. | |
| 2019/0385929 A1 | 12/2019 | Ku et al. | |
| 2020/0075521 A1 | 3/2020 | Elsherbini et al. | |
| 2020/0187912 A1 | 6/2020 | Mgnon et al. | |
| 2020/0303341 A1 | 9/2020 | Kim et al. | |
| 2021/0118852 A1 | 4/2021 | Fay et al. | |
| 2021/0160999 A1 | 5/2021 | Dogiamis et al. | |
| 2021/0183844 A1* | 6/2021 | Cheng | H01L 24/19 |
| 2021/0305133 A1* | 9/2021 | Karhade | H01L 23/4825 |
| 2021/0407919 A1* | 12/2021 | Patil | H01L 23/3128 |
| 2022/0068877 A1 | 3/2022 | Tai et al. | |
| 2022/0399321 A1* | 12/2022 | Gu | H01L 25/50 |
| 2023/0238345 A1* | 7/2023 | Tong | H01L 24/14 257/737 |
| 2023/0359496 A1 | 11/2023 | Majewski et al. | |
| 2023/0402403 A1* | 12/2023 | Chen | H01L 23/3135 |
| 2024/0006375 A1 | 1/2024 | Suthram et al. | |
| 2024/0013851 A1 | 1/2024 | Chen et al. | |
| 2024/0128146 A1* | 4/2024 | Tong | H01L 23/3672 |
| 2024/0347413 A1* | 10/2024 | Huang | H01L 25/105 |
| 2024/0371410 A1* | 11/2024 | Yang | H01L 25/0652 |

OTHER PUBLICATIONS

Extended European Search Report for European Patent Application No. 21189646.9 dated Jan. 31, 2022. 10 pages.

Office Action for European Patent Application No. 21189646.9 dated Jul. 12, 2024. 10 pages.

Office Action for Chinese Patent Application No. 202110795659.0 dated Sep. 6, 2024. 8 pages.

* cited by examiner

INTEGRATED CIRCUIT PACKAGE FOR HIGH BANDWIDTH MEMORY

CROSS-REFERENCE TO RELATED APPLICATION

The present application is a continuation of U.S. patent application Ser. No. 17/970,237, filed Oct. 20, 2022 which is a continuation of U.S. patent application Ser. No. 17/157,278 (now U.S. U.S. Pat. No. 11,488,944), filed on Jan. 25, 2021, the disclosure of which is incorporated herein by reference.

BACKGROUND

In order to meet increasing memory bandwidth needs of current and future technologies, a high-bandwidth memory (HBM) stack provides several DRAM dies stacked upon one another within a small area. The dies of the HBM stack can be interconnected through microbumps and vias, and the stack further may be connected to a nearby logic die, such as a graphics processing unit (GPU), by an interposer.

Channels may be formed in the interposer to communicatively link the HBM stack to the logic die. Because of the narrow bump pitch of the HBM stack and the high density of channels needed to connect to the HBM stack, the channels are typically formed in a silicon interposer using semiconductor fabrication techniques. Thus, the silicon interposer is positioned underneath both the logic die and the HBM stack in order for the interposer channels to provide connections at the necessary pitch and density.

Positioning both the logic die and the HBM stack on the interposer requires a large interposer to be used. The interposer will routinely occupy an area three or more times that of the logic die. However, the use of large silicon interposers adds unwanted cost to the package. Semiconductor fabrication is relatively expensive compared to printed circuit board manufacture. Additionally, the large interposer is prone to warpage, which in turn results in yield losses during assembly and manufacture.

BRIEF SUMMARY

Next generation HBM stacks have a wider microbump pitch, making it possible for the channels connecting the HBM stack to the logic die to be made wider. The use of wider channels for connecting the HBM stack and logic die opens up the opportunity to use different connection solutions and materials, such as printed traces, including organic traces, in place of more silicon interposer channels. The printed traces at least partially replace the silicon interposer channels to reduce material costs and simplify production.

One aspect of the present disclosure is directed to an integrated circuit package including a substrate configured to receive one or more high-bandwidth memory (HBM) stacks on the substrate, an interposer positioned on the substrate and configured to receive a logic die on the interposer, a plurality of interposer channels formed in the interposer, wherein the plurality of interposer channels are connected to the logic die, and a plurality of substrate traces formed in the substrate, wherein the logic die is configured to interface the one or more HBM stacks through the plurality of interposer channels and the plurality of substrate traces.

In some examples, each interposer channel may have a first cross-sectional area, and each substrate trace may have a second cross-sectional area that is greater than the first cross-sectional area.

In some examples, each substrate trace may have a loss of about 0.2 dB/mm or less at an operating frequency of about 2 GHz.

In some examples, the interposer channels may be configured to connect to one or more physical interfaces (PHYs) of the logic die, wherein each PHY is positioned along a side edge of the logic die and configured to provide a protocol for managing a corresponding HBM stack.

In some examples, for each side edge of the logic die having a logic die PHY, a corresponding side edge of the interposer may extend beyond the side edge of the logic die on the order of 1 millimeter.

In some examples, the plurality of interposer channels may be formed in the interposer in a fan-out configuration.

In some examples, a first end of the plurality of interposer channels connected to the logic die may have a pitch of 55 µm, and a second end of the plurality of interposer channels connected to the plurality of substrate traces may have a pitch of 96 µm.

In some examples, the one or more HBM stacks may be HBM3 stacks, and each HBM3 stack may include a plurality of microbumps having a pitch greater than 55 µm.

In some examples, a space between adjacent microbumps of the plurality of microbumps of the HBM3 stack may be 85 µm or greater.

In some examples, the substrate may be a multilayer substrate.

In some examples, each substrate trace may have a width of about 5 µm and a spacing of about 5 µm, and the plurality of substrate traces may be distributed over four signal layers of the multilayer substrate.

In some examples, each substrate trace may have a width of about 4 µm and a spacing of about 4 µm, and the plurality of substrate traces may be distributed over three signal layers of the multilayer substrate.

In some examples, each substrate trace may have a width of between about 1-2.5 µm and a spacing of between about 1-2.5 µm, and the plurality of substrate traces may be distributed over two signal layers of the multilayer substrate.

In some examples, the multilayer substrate may be a hybrid substrate including a first plurality of upper layer substrate traces having a first width, and a second plurality of lower layer substrate traces having a second width greater than the first width.

In some examples, the substrate may be a high-density organic package, and the plurality of substrate traces may be organic traces.

In some examples, the integrated circuit package may further include the one or more HBM stacks and the logic die.

Another aspect of the present disclosure is directed to a method of manufacturing an integrated circuit package, including printing a plurality of traces in a substrate, positioning one or more high-bandwidth memory (HBM) stacks on the substrate, whereby the plurality of traces are communicatively connected to the HBM stacks, positioning a logic die on an interposer, connecting one or more physical interfaces (PHYs) of the logic die to a plurality of interposer channels formed in the interposer, and positioning the interposer on the substrate adjacent to the HBM stacks, wherein the plurality of interposer channels are communicatively connected to the plurality of traces in the substrate.

In some examples, positioning the one or more HBM stacks may include connecting the one or more HBM stacks to the substrate by a first plurality of microbumps having a first pitch, In some examples, positioning a logic die on the interposer may include connecting the logic die to the interposer by a second plurality of microbumps having a second pitch different from the first pitch.

In some examples, forming a plurality of interposer channels in the interposer may include fanning out the interposer channels from the second pitch to the first pitch.

DETAILED DESCRIPTION

Overview

The present disclosure provides for an HBM package having reduced packaging costs. The HBM package includes HBM stacks having an increased microbump pitch, as compared to prior packages. The increased microbump pitch allows for the channels connecting the HBM stacks to the logic die to be made wider, which in turn allows for use of printed technologies, such as an organic trace printed in the package substrate supporting the interposer. The printed traces may then be connected to channels formed in the interposer in order to interface the HBM stack to the logic die.

The microbump pitch of the HBM stack may be increased without having to increase a microbump pitch of a physical interface (PHY) at the logic die. For instance, a logic PHY may still have a microbump pitch of 55 μm, but the traces printed in the substrate may have a pitch of about 96 μm. Connection between the different pitches may be achieved in the interposer by providing interposer channels in a fan-out configuration that gradually widens from the 55 μm pitch of the PHY microbumps to the 96 μm pitch of the printed traces.

An HBM stack may have a microbump pitch of about 96 μm or greater, with a spacing of 85 μm or more between 25 μm diameter microbumps. Within the three spaces between four microbumps of the HBM stack, there would be about 255 μm of space for traces to be printed. If the traces were to have a width of about 5 μm and are spaced about 5 μm apart from one another, then only about 26 traces may be arranged on a single layer of the substrate. In order to increase the density of the printed traces, a multilayer substrate may be used. The multilayer substrate may include alternating signal layers and ground layers. Thus, for the 5 μm wide traces with 5 μm spacing, four signal layers may be provided in order to provide about 100 signal lines to the HBM stack within the 255 μm of space.

Alternatively, signal lines can be condensed within the 255 μm of space at the HBM stack by providing narrower printed traces with narrower spacing in between. For instance, 4 μm wide traces with 4 μm spacing in between each trace may require only three signal layers, and 2.5 μm wide traces with 2.5 μm spacing in between each trace may require only two signal layers. In the case of relatively narrow traces, an integrated thin-film high-density organic package may be provided in order to facilitate packaging. Thin-film high-density organic packaging can allow for traces as narrow as about 2 μm and spaced about 2 μm apart. In other instances, thin-film high-density organic packaging for relatively narrow traces may be combined with other packaging techniques for relatively wider traces in a hybrid multilayer substrate. The hybrid substrate may include higher density layers formed on top of relatively lower density layers.

One advantage of providing the printed traces is that it reduces the amount of semiconductor fabrication required in order to interconnect the logic die and the HBM stacks. Instead of the interposer having to extend underneath both the logic die and the HBM stacks, the use of printed traces to replace the interposer channels allows for a smaller interposer underneath only the logic die to be utilized. Extending the interposer about a millimeter beyond the edge of the logic die provides enough space to widen the pitch of the interposer channels to match the wider pitch of the HBM stacks and printed traces. As a result, the overall size of the interposer can be significantly reduced, by as much as half or more.

Another advantage of providing the printed traces is that HBM stacks can be positioned farther away from the logic die while maintaining good operation performance. Because the printed traces are thicker and wider than the interposer channels, the traces have lower attenuation than the interposer channels. For instance, only about 0.2 dB/mm of attenuation is observed for an integrated circuit operating at about 2 GHz. This reduced attenuation allows for signals between the logic die and HBM stacks to travel a longer distance. This loosens the assembly requirements for positioning the HBM stacks on the substrate, since HBM stacks can be positioned farther away from the logic die.

Yet another advantage of providing the printed traces is reduced production cost for the integrated circuit package. Firstly, because interposer materials and production is more costly than substrate materials and production, replacing interposer materials and production results with substrate materials and production reduces the packaging cost. Secondly, the freedom to include HBM stacks throughout the substrate even at a distance from the logic die increases a yield of the package, which also results in an overall cost savings.

Example Systems

Figure 1:
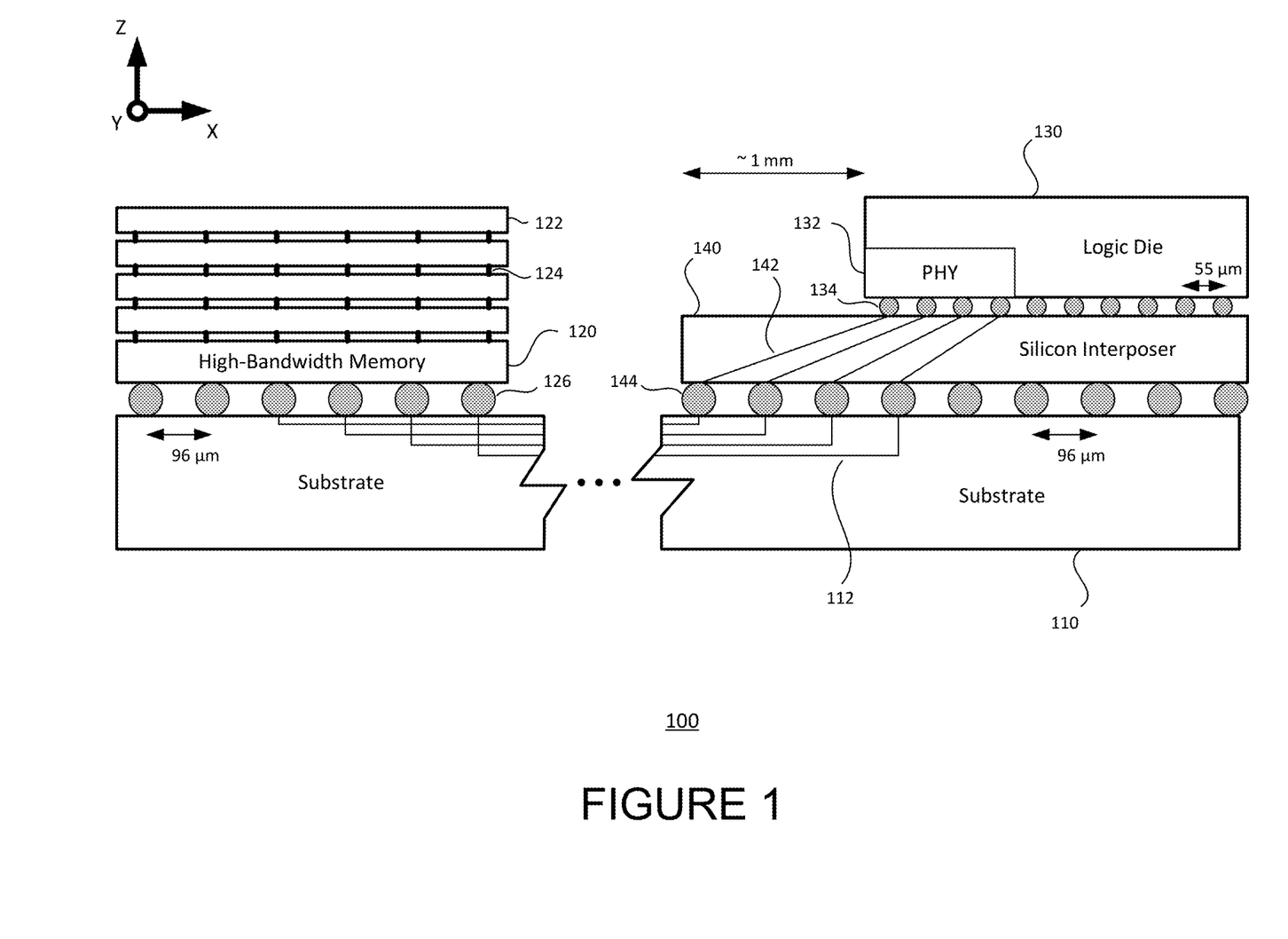
FIG. 1 is a side view of a portion of a high-bandwidth memory (HBM) package structure according to aspects of the present disclosure.

FIG. 1 illustrates a side view of a portion of an example high-bandwidth memory (HBM) package 100 to demonstrate a structure of the example HBM package. The HBM package 100 includes a substrate 110, and an HBM stack 120 positioned on an upper surface of the substrate 110, and a logic die 130 positioned on the upper surface of the substrate 110 close to the HBM stack 120. Positioning the HBM stack 120 and logic die 130 close to one another is advantageous for increasing processing speed since the time needed for the logic die processor to access the memory is reduced.

The substrate 110 may be a package substrate. The package substrate may support fine pitch interconnections. The substrate 110 may include traces 112 printed on the substrate 110 for interconnection of components mounted to the substrate 110. In some examples, the substrate 110 may be an organic package substrate and may include organic traces. Also, in some examples, the substrate may include multiple stacked layers, whereby interconnections between the components mounted to the substrate may be made through the stacked layers in order to increase a density of the interconnections.

The HBM stack 120 may include a plurality of dynamic random access memory (DRAM) memory chips 122 vertically stacked one on top of another using three-dimensional (3D) vertical stacking techniques. For clarity, only a single memory chip 122 is labeled in FIG. 1, although four are illustrated. The vertically stacked memory chips may be interconnected by a plurality of vias 124, such as through-silicon vias (TSVs). Stacking more DRAM chips on top of one another increases the memory capacity. Although FIG. 1 illustrates only four memory chips, any other number of memory chips may be contained in an HBM stack. The stacked DRAM chips are also known to improve energy efficiency as compared to other high-bandwidth memory options. In this regard, HBM stacks may have a bandwidth of 512 GB/s or higher.

The logic die 130 may be one or more processors configured to communicate with the HBM stack 120 in order to access data from and store data in the stack 120. The logic die 130 may be a graphics processing unit (GPU), field-programmable gate array (FGPA), application-specific integrated circuit (ASIC), central processing unit (CPU), or other known electronic circuit that functions as a processor. The logic die 130 may include one or more physical interfaces (PHYs) 132. The PHYs may be positioned along any one or combination of side edges of the logic die and may contain protocols for interfacing the processing circuitry of the logic die with the memory of the HBM stack 120.

Each of the HBM stack 120 and the logic die 130 may be mounted to the substrate by high-density solder microbumps. For each given component mounted to the substrate 110, the microbumps may be spaced out evenly according to a respective predetermined bump pitch. In some examples, the bump pitch of the HBM stack 120 may be the same or larger than the bump pitch of the logic die 130. For instance, recent developments in HBM technology have yielded a third-generation HBM stack (HBM3) having a bump pitch that is slightly larger than previous HBM stacks. In particular, the bump pitch of the microbumps 126 in the HBM3 stack is 96 μm. By comparison, the logic die 130 shown in FIG. 1 includes microbumps 134 having a bump pitch of 55 μm, which is the same as the 55 μm bump pitch of the previous-generation stack.

Figure 2:
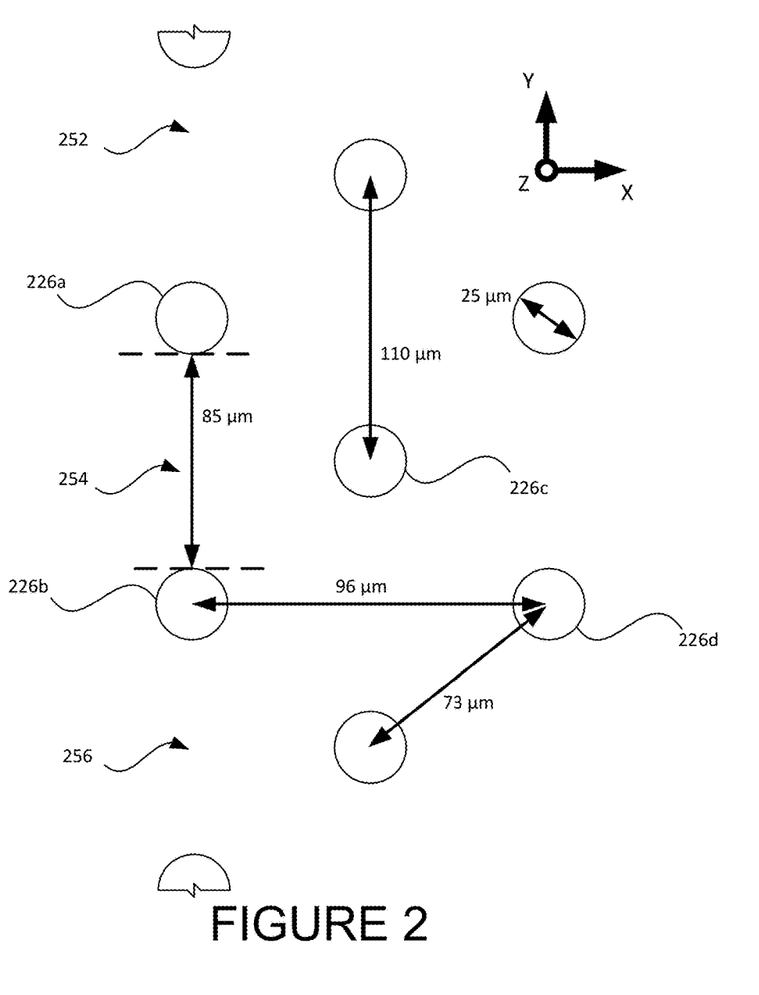
FIG. 2 is a diagram illustrating an example microbump arrangement of the HBM package of FIG. 1.

FIG. 2 further illustrates an example layout of microbumps 226a, 226b, 226c, 226d for an HBM3 stack, which may correspond to the HBM stack 120 shown in FIG. 1. In FIG. 2, each microbump has a diameter of about 25 μm and a horizontal spacing of 110 μm from center to center between adjacent microbumps, such as between microbumps 226a and 226b. This results in an open space of 85 μm between edges of adjacent microbump in the horizontal (Y-axis) direction.

Additionally, the microbumps of FIG. 2 are spaced in the depth (X-axis) direction differently than they are spaced in the horizontal (Y-axis) direction, although in other embodiments the spacing may be the same. In the example of FIG. 2, the spacing from center to center between adjacent microbumps 226b and 226d in the depth direction is 96 μm. The microbumps are also aligned along a diagonal direction within the XY plane, and spacing in the diagonal direction is different than both the depth and horizontal directions, although in other embodiments the spacing may be the same. In the example of FIG. 2, the spacing from center to center between diagonally adjacent microbumps 226b and 226c in the diagonal direction is 73 μm.

The spacing of the microbumps, particularly in the Y-axis direction in FIG. 2, dictates an amount of substrate traces that can be passed between microbumps in order to form connections to the HBM stack.

In some examples, a multilayer substrate may be provided in order to increase the number of interconnections between the logic die and the HBM stack. In a multilayer substrate, additional layers of substrate channels may be formed in signal layers of the substrate beneath the top surface. The top surface layer (which itself may be a signal layer) and the lower signal layers may all be separated by dielectric layers. The lower layer traces may further be connected to the HBM stack through substrate vias in order to increase the overall number of substrate traces connected to the HBM stack. In some examples, the substrate traces may be striplines. Striplines provide the advantage of reduced crosstalk in order to maintain good signal integrity through the substrate.

In the case of the top surface layer of the substrate, and as noted in connection with FIG. 2, it is necessary to route the substrate traces between microbumps, and the spacing of the microbumps dictates the amount of traces that can be effectively routed on the top surface. In a similar vein, for lower layers of the substrate, it is necessary to route the substrate traces between the vias. Thus, the spacing of the vias may dictate the amount of traces that can be effectively routed on the lower layers of the substrate. Typically, the width of the substrate vias is less than the width of the microbumps. For instance, the vias may have a width of about 20 μm, thus leaving a space of about 90 μm between vias. As such, typically at least as many traces than can be routed on the surface layer of the substrate can also be routed in the lower layers of the substrate.

When considering four microbumps of FIG. 2 in the Y-axis direction spaced apart by 3 gaps, such as gaps 252, 254 and 256 shown in FIG. 2, the microbumps leave a total space of about 255 μm (3 gaps*85 μm/gap) in which substrate traces may be routed. Similarly, the vias in lower layers of the substrate (not shown) may leave a total space of about 270 μm (3 gaps*90 μm) for the substrate traces to be routed.

If substrate traces having a width of 5 μm and a spacing of 5 μm are used, then it has been found that on average about 26 traces may be routed in each layer. Thus, if it is desired to connect 100 traces to the HBM stack within the space of four microbumps, it would be necessary to include four signal layers in the multilayer substrate. This would require at least 9 total layers in the substrate, including the signal layers, dielectric layers, and ground plane.

Alternatively, if substrate traces having a width of 4 μm and a spacing of 4 μm are used, then it has been found that on average about 33 traces may be routed in each layer. Thus, if it is desired to connect 100 traces to the HBM stack within the space of four microbumps, it would be necessary to include only three signal layers in the multilayer substrate. This would require at least 7 total layers in the substrate, including the signal layers, dielectric layers, and ground plane.

As a further alternative, if substrate traces having a width of up to about 1-2.5 μm and a spacing of up to about 1-2.5 μm are used, then it has been found that at least 50 traces may be routed in each layer. Thus, if it is desired to connect 100 traces to the HBM stack within the space of four microbumps, it would be necessary to include only two signal layers in the multilayers substrate. This would require at least 5 total layers in the substrate, including the signal layers, dielectric layers, and ground plane.

In some further examples, a hybrid substrate may be used. The hybrid substrate may include both one or more layers of relatively wide substrate traces and one or more layers of relatively thin substrate traces. In many hybrid substrates, such as in some recently developed high-density organic packages including organic traces, the relatively wide substrate traces are formed in the lower layers of the substrate and the relative thin substrate traces are formed in the upper layers, top surface, or both. For instance a hybrid substrate may include three fine layers on top of a standard layer. The fine layers may include traces having width/spacing (W/S) of 2/2 μm, 2.5/2.5 μm or 4/4 μm, whereas the standard layer or layers may include traces having W/S of 4/4 μm or 5/5 μm.

Returning to FIG. 1, the HBM package 100 of FIG. 1 also includes an interposer 140 positioned on top of the substrate 110. The interposer is positioned to receive the logic die 130 on top. A plurality of interposer channels 142 formed in the interposer 140 are configured to connect the logic die PHYs to the traces 112 formed in the substrate 110. The connections may be formed between the microbumps 144 supporting the interposer 140 on top of the substrate 110 and the microbumps 134 supporting the logic die 130 on top of the interposer 140. In some examples, the interposer 140 may be a silicon interposer, and the channels 142 formed therein may be silicon interposer channels.

In some examples, the bump pitch between the logic die microbumps 134 and the interposer microbumps 144 may be different. For instance, in FIG. 1, the bump pitch of the logic die microbumps 134 is 55 μm but the bump pitch of the interposer microbumps 144 is 96 μm. A relatively low bump pitch is commonly used for the logic die microbumps 134 in order to maintain a small die size and keep materials costs down. Conversely, a relatively high bump pitch may be necessary for the interposer microbumps 144 in order to facilitate connections with the traces printed in the substrate, which may not be able to be scaled down to a pitch as small as the bump pitch of the logic die 130. For instance, each substrate trace 112 may have a width of about 5 μm or more and require a spacing of 5 μm or more between each trace. Thus, in order to connect the logic die microbumps 134 to the interposer microbumps 144, the interposer channels 142 may be arranged in a fan out configuration that widens from the 55 μm pitch to the 96 μm pitch.

In order to provide sufficient space for the fan out configuration of the interposer channels 142, a side edge of the interposer 140 may extend beyond a corresponding side edge of the logic die 130. The extra length of the interposer 140, compared to that of the logic die 130 may provide sufficient space for fanning out of the interposer channels both underneath the logic die and beyond the edge of the logic die. This is illustrated in FIG. 1, in which an edge of the interposer 140 extends beyond the edge of the logic die 130 on the order of 1 millimeter in order for the logic die microbumps 134 to connect to the interposer microbumps 144 without extending backward in the X direction away from the HBM stack.

The fan out configuration of the interposer channels 142 is advantageous for connecting the logic die 130 to substrate traces 112 in order to communicate between the HBM stack 120 and the logic die 120. Without the substrate traces 112, it would be necessary to connect both the HBM stack 120 and the logic die 130 to the interposer channels. Partially replacing the interposer channels with substrate traces for HBM communication is beneficial for multiple reasons:

1) Partially replacing the interposer channels with substrate traces decreases materials costs from the interposer. Without substrate traces, the interposer must be extended from the microbumps underneath the logic die to the microbumps underneath the HBM stack. However, with the substrate traces, the interposer positioned underneath only the logic die, and not underneath the HBM stack. Thus, the overall size of the interposer is decreased, which reduces the materials costs.

2) Partially replacing the interposer channels with substrate traces also decreases production costs. Forming silicon interposer channels in a silicon interposer is typically done through semiconductor fabrication, and is more expensive than forming traces on a printed circuit board. Without substrate traces, the interposer channels must be formed all the way from the microbumps underneath the logic die to the microbumps underneath the HBM stack. However, with the substrate traces, the silicon interposer channels can be formed for a shorter length, from the microbumps underneath the logic die to an edge of the shorted silicon interposer. Thus, the overall length of the interposer channels is decreased, and replaced with much less expensive printed circuit board traces, which reduces the production costs for connecting the HBM stack to the logic die.

3) Partially replacing the interposer channels with substrate traces also reduces attenuation between the HBM stack and the logic die. Silicon interposer channels are narrow in width (in the Y axis direction of FIG. 1) and narrow in thickness (in the Z axis direction of FIG. 1), which leads to relatively high attenuation characteristics, typically about 1 db/mm at operating frequencies at or around 2 GHz. By comparison, organic substrate traces are relatively wider in width (in the Y axis direction of FIG. 1) and also relatively thicker (in the Z axis direction of FIG. 1), meaning that less attenuation occurs along the length of the traces less, typically about or less than 0.2 dB/mm at operating frequencies at or around 2 GHz. Thus, by at least partially replacing the silicon interposer channel connecting the HBM stack and the logic die with an organic trace, an overall attenuation in the connection between the HBM stack and the logic die is reduced.

4) Partially replacing the interposer channels with substrate traces also loosens at least some restrictions on the positioning of HBM stacks on the substrate. As noted in reason (3) above, attenuation in the connection between the HBM stack and the logic die is reduced by the inclusion of organic traces. Consequently, the overall length of the connection between an HBM stack and the logic die may be increased without adversely affecting communication between the two components. As such, exclusively using the relatively high-attenuation silicon interposer channels to connect the logic die to HBM stacks requires each HBM stack to be positioned as near as possible to the logic die. By contrast, using the relatively low-attenuation combination of silicon interposer channels and organic substrate traces to connect the logic die to HBM stacks does not require the HBM stacks to be positioned so near to the logic die. This, in turn, increases the area of the substrate on which HBM stacks may be positioned relative to the logic die, thus loosening at least some resections on the placement of the HBM stacks on the substrate.

5) Partially replacing the interposer channels with substrate traces also improves overall yield of the HBM package. As noted in reason (4) above, the relatively low-attenuation combination of silicon interposer channels and organic substrate traces to connect the logic die to HBM stacks permits for HBM stacks to be positioned in additional locations of the substrate that are not as close as possible to the logic die. This, in turn, increases the overall number of HBM stacks that can be positioned on the substrate and connected to the logic die. Increasing the number of HBM stacks results in an overall improvement of yield for the HBM package, since the bandwidth of the package increases while the size of the package remains the same.

To illustrate the above-noted advantages of the HBM package of FIGS. 1 and 2, FIGS. 3-6 are diagrams show example layout diagrams of HBM packages in accordance with the present disclosure.

Figure 3:
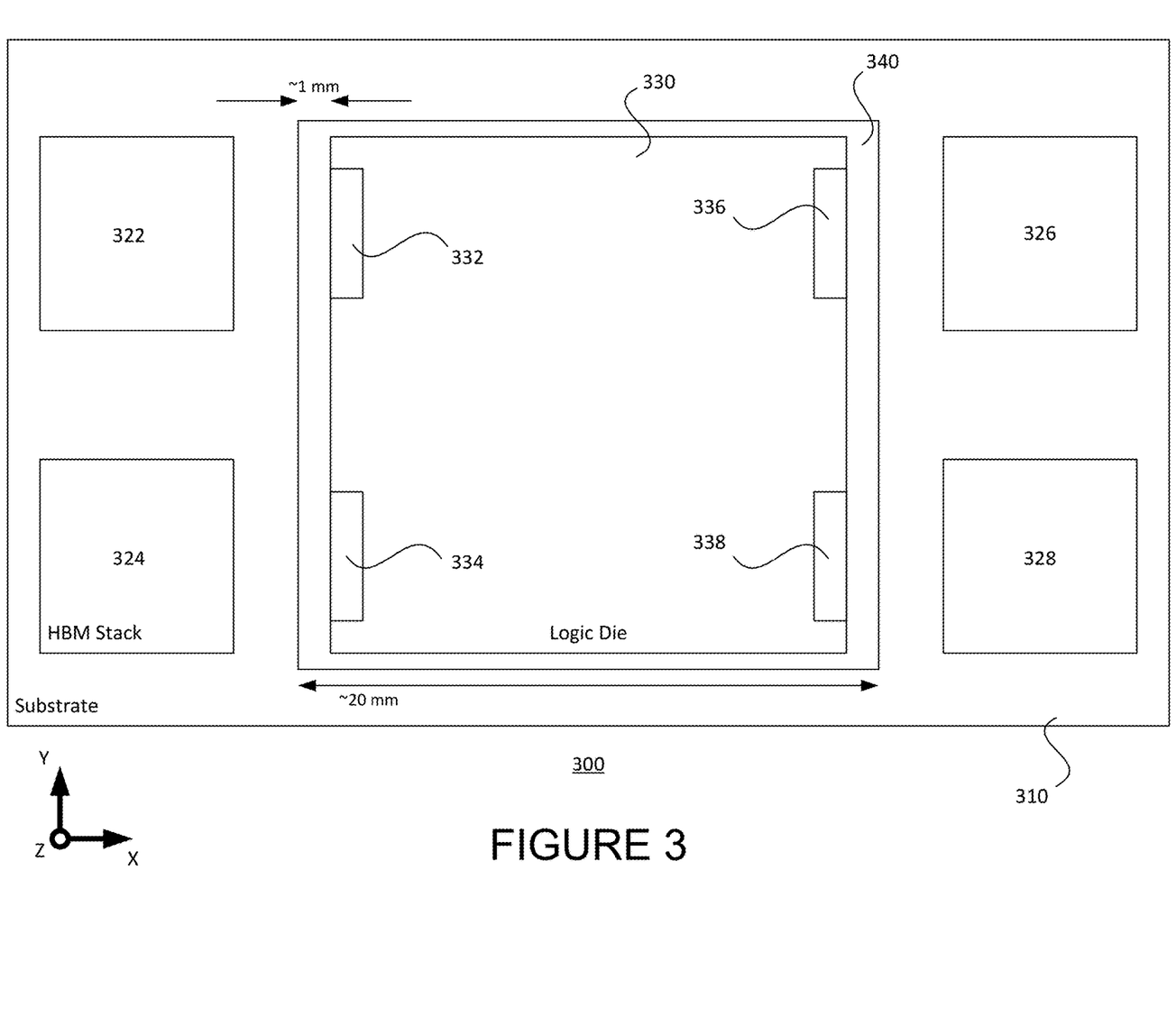
FIGS. 3-7 are top views of example HBM package structures according to aspects of the present disclosure.

FIG. 3 illustrates a first example HBM package 300 including a substrate 310, four HBM stacks 322, 324, 326, 328, and a logic die 330 positioned in a middle of the substrate 310. A silicon interposer 340 is positioned underneath the logic die. On each side of the logic die 330, an edge of the silicon interposer 340 extends in the horizontal (X-axis) direction beyond the edge of the logic die 330. The extension is sufficiently long enough to permit for the silicon interposer channels formed in the silicon interposer 340 to be arranged according to a fan-out configuration in order to connect microbumps between the logic die 330 and the interposer 340 to the microbumps between the interposer 340 and the substrate 310. In the example of FIG. 3, the extension is about 1 millimeter on either side of the logic die.

The logic die 330 further includes a plurality of PHYs 332, 334, 336, 338 arranged at respective edges of the logic die 300 which are the same edges over which the interposer 340 is extended. Each PHY is positioned adjacent to a corresponding HBM stack, whereby each corresponding PHY and HBM stack may be connected to each other. In the example of FIG. 3, PHY 332 may be connected to HBM stack 322, PHY 334 may be connected to HBM stack 324, PHY 336 may be connected to HBM stack 326 and PHY 336 may be connected to HBM stack 326. The connections may be made partially through interposer channels and partially through substrate traces, as shown in the example configuration of FIG. 1.

One advantage of the HBM package of FIG. 3 is the reduced size of the interposer and, by extension, reduced length of the interposer channels, as compared to HBM packages having interposers supporting both the logic die and HBM stacks. Typically, an interposer would have a length in the X-axis direction of about 46 mm in order to be positioned underneath both a logic die and HBM stacks on both sides of the logic die. By contrast, the interposer of FIG. 3 has a length of only about 20 mm in the X-axis direction. This means that the overall size of the interposer may be reduced by about 56%, significantly reducing materials costs. Additionally, a length of the silicon interposer channels may be reduced by at least about 26 mm, which further reduces fabrication costs.

Figure 4:
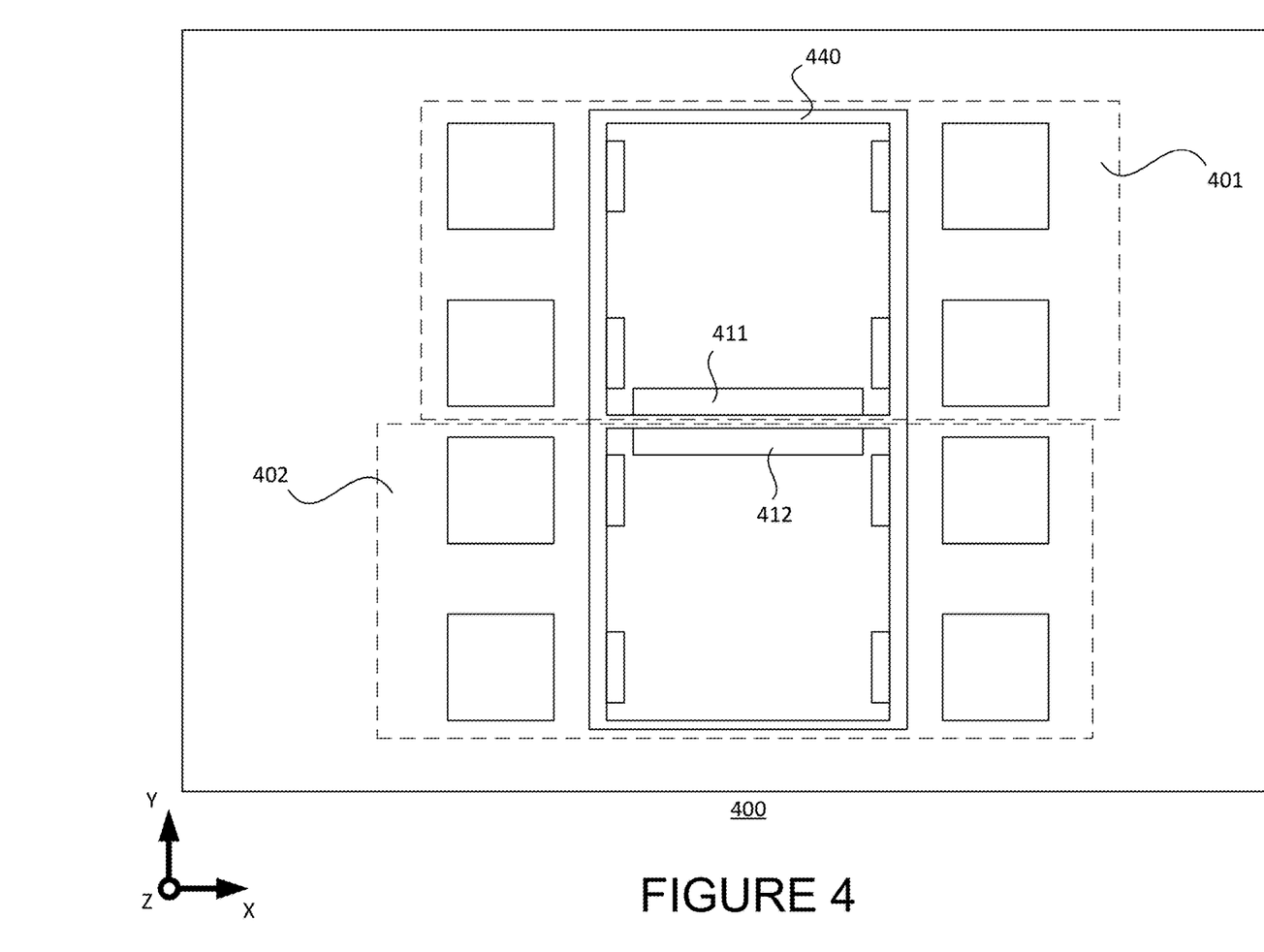

FIG. 4 illustrates a second example HBM package 400 including a first HBM package unit 401 and a second HBM package unit 402. The HBM package units are aligned with one another along a Y-axis width direction of the HBM package 400, and are positioned on a common interposer 440. Each HBM package unit 401, 402 includes a respective logic die, PHYs and HBM stacks to connect to the PHYs by a one-to-one correspondence. These components are comparable to the components described in connection with FIG. 3. Additionally, each HBM package unit 401 includes a respective high-bandwidth interface (HBI) unit 411, 412 for die-to-die (D2D) communication. The HBI units enable communication between each logic die so that the HBM package 400 may function as a system on a chip (SoC) having a core split across multiple logic dies.

The example HBM package 400 of FIG. 4 has the same or similar advantages as those of the HBM package 300 of FIG. 3. Additionally, the overall memory bandwidth and capacity of the package is increased by inclusion of the second logic die and the second group of HBM stacks connected to the second logic die. The increase in memory bandwidth and capacity is achieved with only a corresponding increase in area of the interposer, but without having to provide a second, separate interposer.

Figure 5:
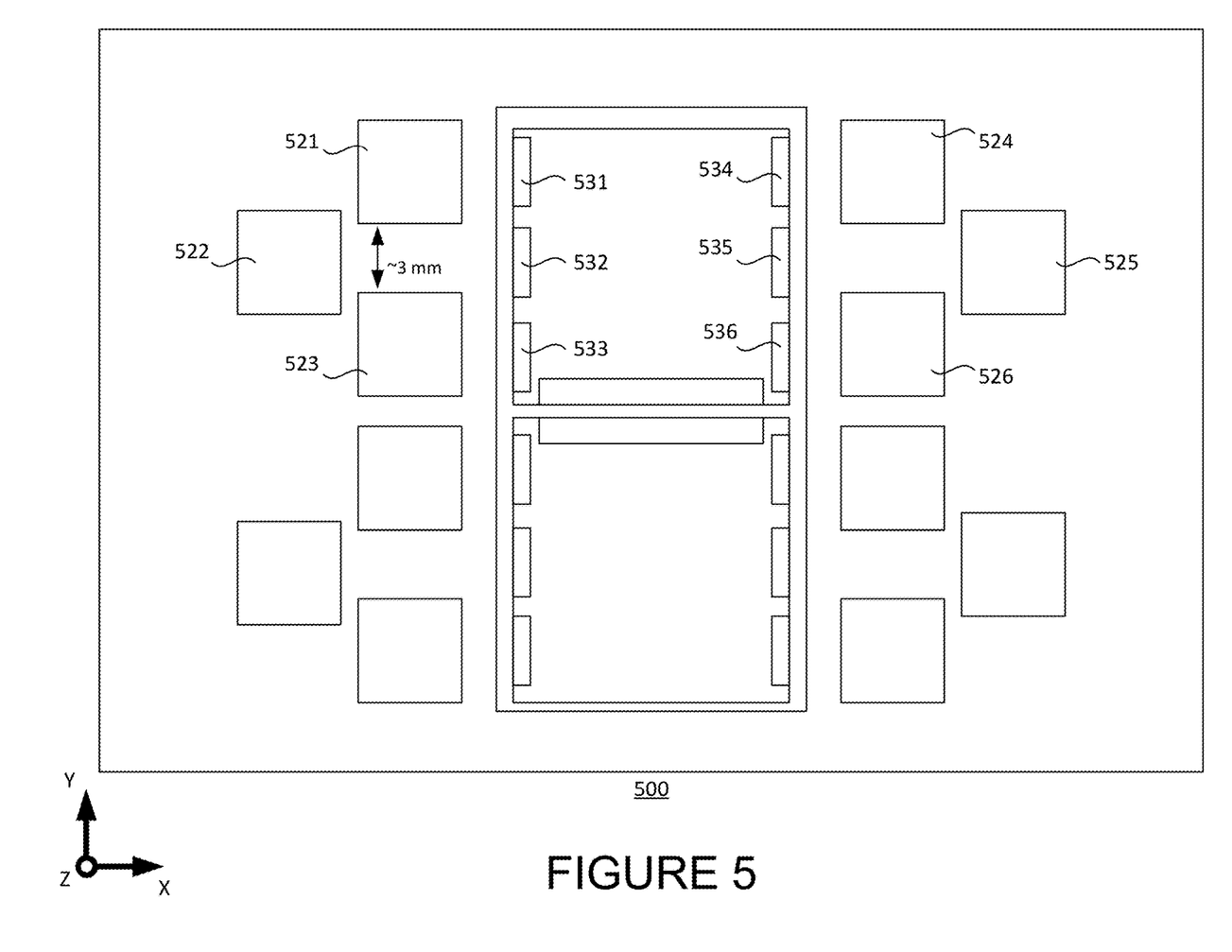

FIG. 5 illustrates a third example HBM package 500 having a higher density of memory included in the package. Like the HBM package of FIG. 4, the HBM package 500 of FIG. 5 includes two HBM package units are aligned along the Y-axis and connected by HBI units. The individual components are comparable to the components described in connection with FIG. 4. Unlike in FIG. 4, the HBM package 500 of FIG. 5 includes three PHYs on either side of each logic die, and each PHY connects to a respective HBM stack. For instance, on one side of the logic die, PHY 531 may be connected to HBM stack 521, PHY 532 may be connected to HBM stack 522, and PHY 533 may be connected to HBM stack 523. Comparably, on an opposite side of the logic die, PHY 534 may be connected to HBM stack 524, PHY 535 may be connected to HBM stack 525, and PHY 536 may be connected to HBM stack 526.

The cumulative widths of the three HBM stacks on either side of the logic die is greater than the width of the logic die. Therefore, all three HBM stacks cannot be positioned immediately adjacent to their respective PHYs. Instead, two out of three of the HBM stacks are positioned immediately adjacent to their respective PHYs, and the third HBM stack is positioned at a greater distance from the logic die than the other two HBM stacks. For example, in FIG. 5, each of HBM stacks 521 and 523 are positioned adjacent to their respective PHYs 531 and 533, while HBM stack 522 is positioned at a greater distance from its respective PHY 532 in the X-axis direction. Because the connection between the HBM stack 522 and PHY 532 is facilitated at least in part by organic traces on the substrate, the decreased attenuation of the connecting traces at least offsets attenuations caused by the increased distance between the components.

Although the space between HBM stacks 521 and 523 is narrower than the offset HBM stack 522, this space may be sufficiently wide to allow passage of the substrate traces between PHY 532 and HBM stack 522. For example, the space may be at least 3 mm wide. In the example of FIG. 5, the space is about 3 mm wide.

Advantages of the example HBM package 500 of FIG. 5 include the ability to position HBM stacks 522 and 525 at a greater distance from the logic die as compared to other HBM packages that rely solely on interposer channels for interconnecting memory and logic. This increased allowable distance enables for more memory to be positioned on the substrate, thus increasing the overall yield of the package.

Figure 6:
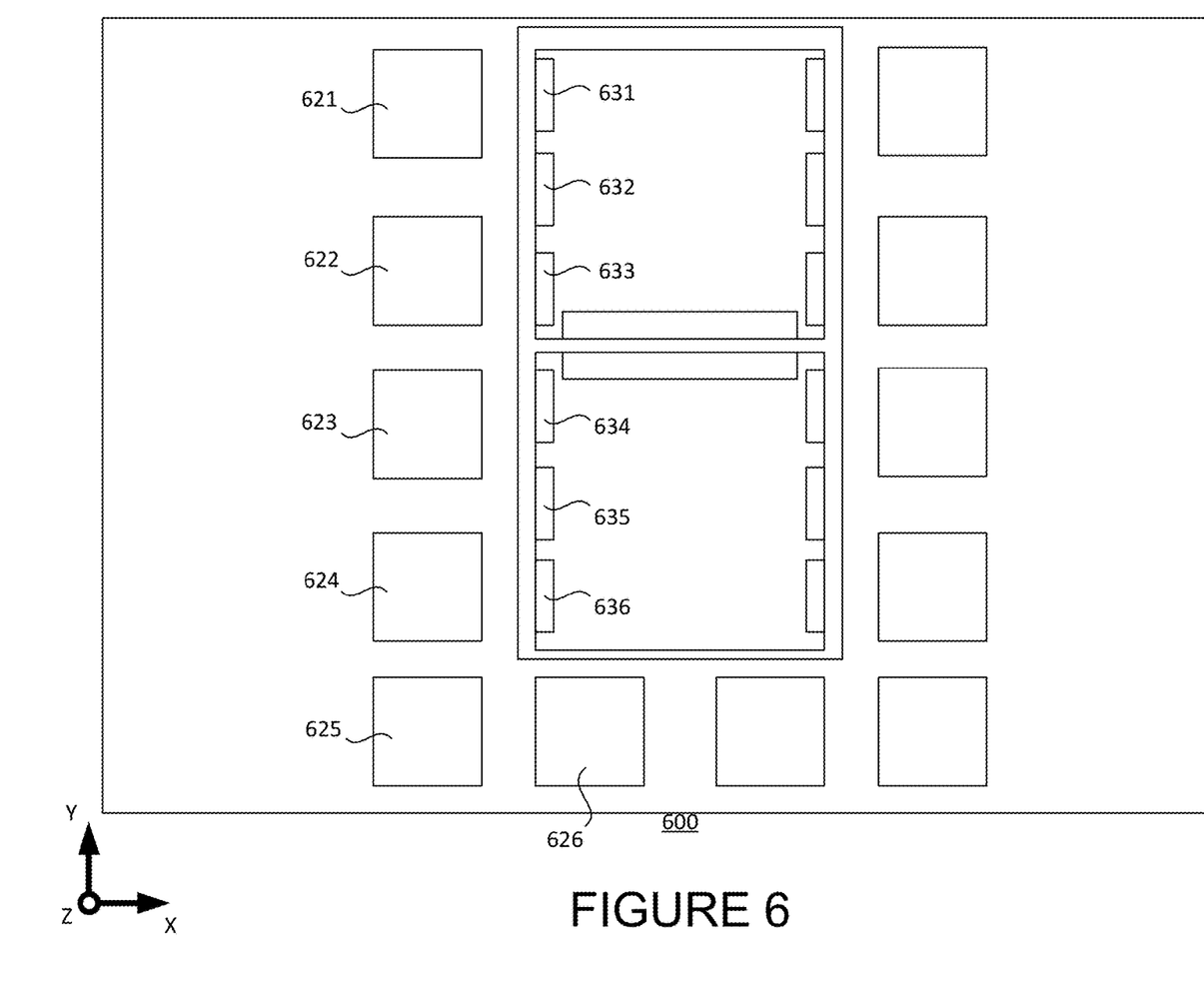

FIG. 6 illustrates a fourth example HBM package 600 having a memory density comparable to that of the example HBM package of FIG. 5. Like the HBM package of FIG. 5, the HBM package 600 of FIG. 6 includes two HBM package units aligned along the Y-axis and connected by HBI units, and each HBM package unit includes three PHYs on either side of each logic die, with each PHY being connected to a respective HBM stack. For instance, on one side of the logic die, PHY 631 may be connected to HBM stack 621, PHY 632 may be connected to HBM stack 522, PHY 633 may be connected to HBM stack 623, PHY 634 may be connected to HBM stack 624, PHY 635 may be connected to HBM stack 625, and PHY 636 may be connected to HBM stack 526. Comparable connections may be made between PHYs and HBM stacks on an opposite side of the logic die.

In the example of FIG. 6, several HBM stacks are positioned at a greater distance from their corresponding PHYs, as compared to the arrangement in FIG. 5. As noted in connection with FIG. 5, these increased distances are enabled by the use of organic substrate traces, for which attenuation of signals carried between the HBM stacks and PHYs is reduced as compared to signals carried exclusively over interposer channels. The individual HBM stacks may be positioned in a manner that provides sufficient space for the substrate channels. Ultimately, the example arrangement of FIG. 6 provides the same advantages of reduced cost and improved yield as in the example of FIG. 5, but further demonstrate the flexibility afforded by the substrate traces for repositioning HBM stacks and rearranging chip elements on the substrate.

Figure 7:
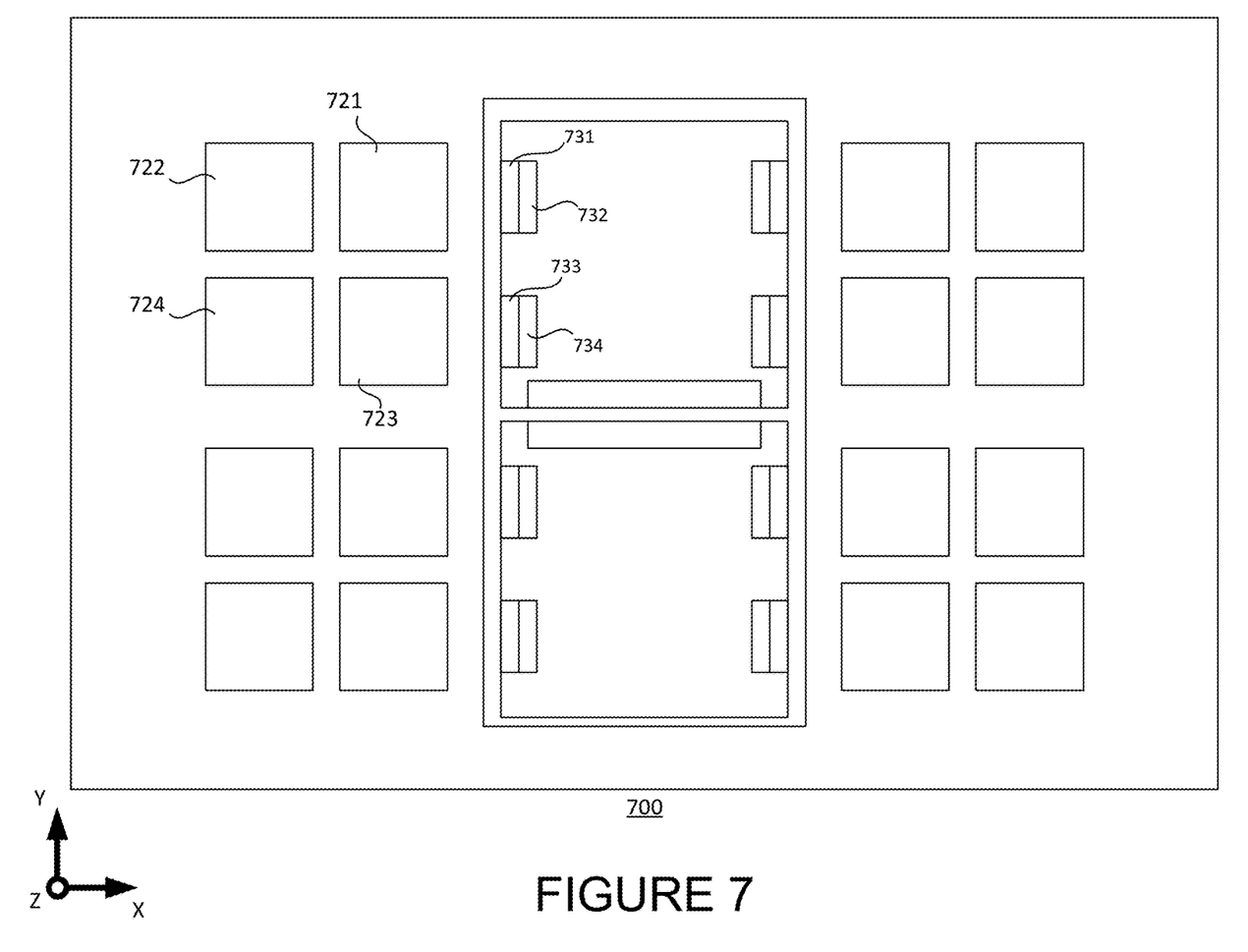

FIG. 7 illustrates a fifth example HBM package 700 having a memory density even greater than that of the example HBM packages of FIGS. 5 and 6. Like the HBM packages of FIGS. 5 and 6, the HBM package 700 of FIG. 7 includes two HBM package units aligned along the Y-axis and connected by HBI units. Unlike the HBM packages of FIGS. 5 and 6, each HBM package unit in FIG. 7 includes four PHYs on either side of each logic die, with each PHY being connected to a respective HBM stack. For instance, on one side of the logic die, PHY 731 may be connected to HBM stack 721, PHY 732 may be connected to HBM stack 722, PHY 733 may be connected to HBM stack 723, and PHY 734 may be connected to HBM stack 724. In order to fit all four PHYs 731-734 along the edge of the logic die, PHYs may be aligned in pairs along the X-axis. For example, in FIG. 7, PHYs 731 and 732 are aligned with one another, and PHYs 733 and 734 are aligned with one another. This is comparable to providing a PHY having double the width. The HBM stacks may similarly be paired with one another. The paired HBM stacks may be aligned along the X-axis direction in order to align with the additional PHYs. For example, in FIG. 7, HBM stacks 721 and 722 are aligned with one another, and HBM stacks 723 and 724 are aligned with one another. Comparable connections may be made between PHYs and HBM stacks on an opposite side of the logic die. In total, the HBM package unit 700 of FIG. 7 fits 16 HBM stacks on a surface of the substrate.

In the example of FIG. 7, several HBM stacks are positioned at a distance from their corresponding PHYs comparable to the distances used in the arrangement in FIG. 5. For instance, HBM stacks 721 and 723 of FIG. 7 may be comparable in distance to the logic die compared to HBM stacks 521 and 523 of FIG. 5, and HBM stacks 722 and 724 of FIG. 7 may be comparable in distance to the logic die compared to HBM stack 522 of FIG. 5. As noted in connection with FIG. 5, these increased distances are enabled by the use of organic substrate traces, for which attenuation of signals carried between the HBM stacks and PHYs is reduced as compared to signals carried exclusively over interposer channels.

Example Methods

Figure 8:
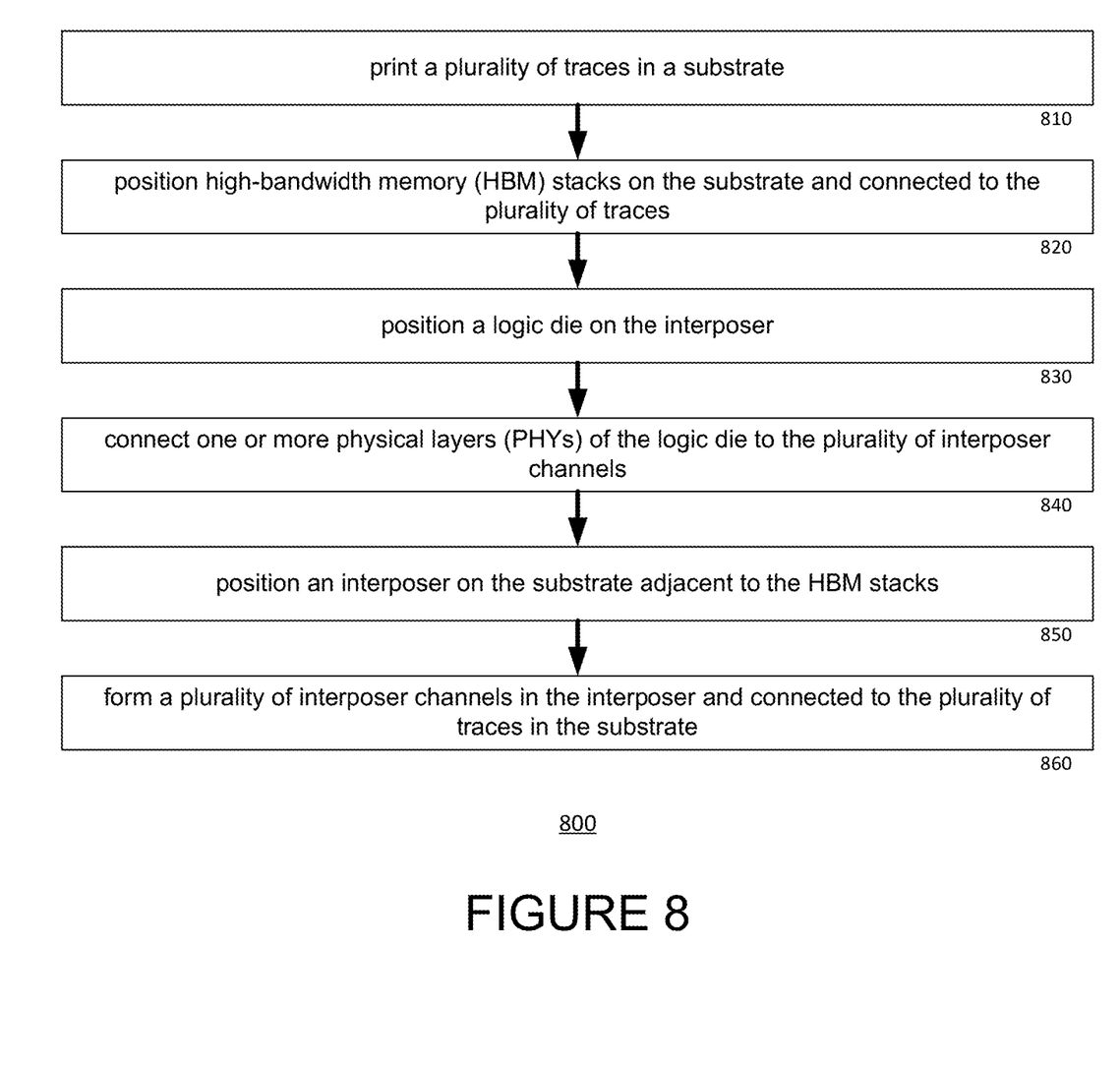
FIG. 8 is a flow diagram of an example HBM package structure fabrication routine according to aspects of the disclosure.

FIG. 8 is a flow diagram illustrating an example HBM package assembly routine 800. The routine is described merely by way of example. It should be understood that additional steps may be included in the routine. Additionally, in some example routines, some of the steps described below may be omitted, performed simultaneously, or performed in a different order.

At block 810, a plurality of traces are printed in a substrate of the HBM package. The substrate may be an organic substrate, and the traces may be organic traces. In some examples, the traces may be printed on a surface of the substrate. In other examples, at least some traces may be formed under the surface of the substrate. For instance, the substrate may be a multilayer substrate.

At block 820, one or more HBM stacks are positioned on top of the substrate. The HBM stacks are further connected to the traces formed on or in the substrate. Connecting an HBM stack to traces may involve forming a plurality of microbumps on the substrate, and then positioning the HBM stack on top of the microbumps. The microbumps may be arranged with a predetermined bump pitch that may correspond to connection ports on the surface of the HBM stack, so that each microbump is connected to a respective port by which data may be transferred to and from the DRAM chips of the HBM stack.

At block 830, a logic die is positioned on an interposer, such as a silicon interposer. The logic die may include one or more PHYs, and positioning the logic die on the interposer may further involve, at block 840, forming microbumps on a top surface of the interposer and connecting the PHYs to the microbumps positioned on the interposer. This positioning connects the communication ports of the logic die to interposer channels formed in the interposer. Forming the microbumps on the interposer may involve arranging the microbumps with a bump pitch that is smaller than the bump pitch of the microbumps on the substrate. The smaller bump pitch may be necessary for interconnection with the logic die.

At block 850, the interposer is positioned on the surface of the substrate. Positioning the interposer on the surface of the substrate may involve forming a plurality of microbumps on the surface of the substrate, and then positioning the interposer on top of the microbumps. Forming the microbumps on the substrate may involve arranging the microbumps with a bump pitch that is greater than the bump pitch of the microbumps on the interposer. The larger bump pitch may be necessary for interconnection with the traces formed in the substrate.

The interposer may be positioned adjacent to the HBM stacks, as opposed to being positioned underneath the HBM stacks. In other words, the HBM stacks may be positioned directly on top of the substrate without the interposer in between, such that the microbumps are in contact with both the HBM stack and the substrate.

At block 860, a plurality of interposer channels may be formed in the interposer. In the case of a silicon interposer, the channels may be silicon interposer channels. The interposer channels may be arranged so as to align with and connect to the microbumps positioned on the substrate underneath the interposer. The microbumps may be arranged according to a predetermined bump pitch, which may be the same or different than the bump pitch of the microbumps for connecting to HBM stacks.

The interposer channels may be arranged to end from a bottom surface of the interposer to a top surface of the interposer. In this manner, the interposer channels may be configured to interconnect components under and on top of the interposer with one another. In some examples, the interposer channels may be formed according to a fan-out configuration, such that a pitch of the interposer channels may differ between the bottom surface and the top surface. In such a configuration, the The example HBM package assembly routine 800 of FIG. 8 and similar routines provide several advantages over previous package assembly routines. Firstly, the routines still utilize an interposer at the logic die, which has the advantage of mitigating noise on the chip core supply by functioning as a deep trench capacitor. However, the interposer is no longer needed to support the HBM stacks, which cuts out both materials and production costs associated with other packaging routines. For a 5 nm ASIC die size occupying an area of about 650 mm$^2$ on the substrate, the interposer size can be reduced from about 2250 mm$^2$ when used to support the surrounding HBM stacks to about 900 mm$^2$ when used to support only the ASIC die. Thus, the interposer is shrunk from a size more than 3× the size of the ASIC die to a size closer to 1.5× the size of the ASIC die. Thus can result in a cost savings between interposer materials, production and assembly. The replacement of interposer channels with substrate traces does increase the materials, production and assembly costs associated with the organic substrate. However, this cost increase is significantly less than the cost savings from the reduced involvement of the interposer.

The example routine 700 also provides for more flexibility as to where HBM stacks may be positioned on the substrate, since the HBM stacks are no longer limited to being positioned in the interposer, and are no longer limited to being positioned immediately adjacent to the logic die. The increased flexibility in positioning the HBM stacks also results in an overall increase in final packaged yield.

Between the increased yield and reduced cost, the HBM package produced according to the present disclosure has been shown to perform at least as well as prior packages at a significantly reduced cost. This means that the HB package assembly routine has a better performance to total cost of ownership ratio (Perf/TCO).

The above examples generally describe a packaging arrangement and manufacturing routine for an HBM package utilizing HBM3-generation HBM stacks. However, it should be understood that the present disclosure is not limited to using HBM3 stacks, or to HBM stacks having a 96 μm bump pitch. The underlying principles of the present disclosure are applicable to any HBM stack for which interconnection to substrate traces is possible, since the interconnection to substrate traces avoids the need to extend the interposer to a position underneath the HBM stack. In this regard, HBM stacks having a bump pitch greater than 96 μm are capable of being used, as well as HBM stacks having a bump pitch less than 96 μm provided that the W/S of the substrate traces is small enough to facilitate interconnection, but the trace width and thickness is large enough to avoid signal attention over the increased connection length. Likewise, the present disclosure is not limited to using logic dies having a 55 μm bump pitch. Rather dies having other bump pitches are equally suitable and applicable to the underlying principles of the present disclosure.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

Most of the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the preceding operations do not have to be performed in the precise order described above. Rather, various steps can be handled in a different order, such as reversed, or simultaneously. Steps can also be omitted unless otherwise stated. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. An integrated circuit package comprising:
a substrate;
a silicon interposer positioned on a top surface of the substrate;
one or more logic dice positioned on a top surface of the silicon interposer;
one or more high-bandwidth memory stacks positioned on the substrate and spaced apart from the silicon interposer;
and
a plurality of printed traces formed in the substrate, wherein the logic die is configured to interface the one or more high-bandwidth memory stacks through the plurality of printed traces.

2. The integrated circuit package of claim 1, wherein the logic die includes a first side and an opposing second side, and wherein a first edge of the silicon interposer extends beyond the first side of the logic die along a first axis and an opposing second edge of the silicon interposer extends beyond the second side of the logic die along the first axis.

3. The integrated circuit package of claim 2, wherein each of the first edge and second edge of the silicon interposer extends beyond the first and second sides of the logic die, respectively, by about 1 millimeter.

4. The integrated circuit package of claim 3, wherein the silicon interposer includes channels electrically connecting the plurality of printed traces formed in the substrate to the logic die, and wherein channels formed in each of a first extension of the silicon interposer between the first side of the logic die and the first edge of the silicon interposer and a second extension of the silicon interposer between the second side of the logic die and the second edge of the silicon interposer are arranged in a fan-out configuration.

5. The integrated circuit package of claim 1, wherein the one or more high-bandwidth memory stacks are configured to connect to one or more corresponding physical interfaces of the logic die, wherein each physical interface is positioned along a respective side of the logic die and configured to provide a protocol for managing a corresponding high-bandwidth memory stack.

6. The integrated circuit package of claim 5, wherein the one or more high-bandwidth memory stacks include first and second high-bandwidth memory stacks, and wherein the logic die includes first and second physical interfaces positioned on a first side of the logic die, wherein the first and second high-bandwidth memory stacks are connected to the first and second physical interfaces in a one-to-one correspondence.

7. The integrated circuit package of claim 6, wherein the one or more high-bandwidth memory stacks include third and fourth high-bandwidth memory stacks, and wherein the logic die includes third and fourth physical interfaces positioned on a second side of the logic die opposite the first side, wherein the third and fourth high-bandwidth memory stacks are connected to the third and fourth physical interfaces in a one-to-one correspondence.

8. The integrated circuit package of claim 1, wherein the one or more logic dice comprises a first logic die and a second logic die, wherein the first logic die includes a first high-bandwidth interface and the second logic die includes a second high-bandwidth interface communicatively coupled to the first high-bandwidth interface for die-to-die communication.

9. The integrated circuit package of claim 8, wherein each of the first logic die and the second logic die are connected to respective high-bandwidth memory stacks, wherein at least some of the the high-bandwidth memory stacks are spaced apart from the first logic die and the second logic die along a first axis, and wherein the first logic die and the second logic die are spaced apart from one another along a second axis perpendicular to the first axis.

10. The integrated circuit package of claim 5, wherein the one or more high-bandwidth memory stacks include first, second, and third high-bandwidth memory stacks, and wherein the logic die includes first, second, and third physical interfaces positioned on a first side of the logic die, wherein the first, second and third high-bandwidth memory stacks are connected to the first, second and third physical interfaces in a one-to-one correspondence.

11. The integrated circuit package of claim 10, wherein the one or more high-bandwidth memory stacks include fourth, fifth and sixth high-bandwidth memory stacks, and wherein the logic die includes fourth, fifth and sixth physical interfaces positioned on a second side of the logic die opposite the first side, wherein the fourth, fifth and sixth high-bandwidth memory stacks are connected to the fourth, fifth and sixth physical interfaces in a one-to-one correspondence.

12. The integrated circuit package of claim 10, wherein the third high-bandwidth memory stack is positioned on the first side of the logic die and farther from the logic die than the first and second high-bandwidth memory stacks are positioned, wherein a width of the third high-bandwidth memory stack is greater than a spacing between the first and second high-bandwidth memory stacks, and wherein the printed traces interfacing the third high-bandwidth memory stack to the logic die are fully positioned within the spacing between the first and second high-bandwidth memory stacks.

13. The integrated circuit package of claim 12, wherein the spacing between the first and second high-bandwidth memory stacks is about 3 millimeters.

14. The integrated circuit package of claim 10, wherein the one or more logic dice comprises a first logic die and a second logic die, wherein the first logic die includes a first high-bandwidth interface and the second logic die includes a second high-bandwidth interface communicatively coupled to the first high-bandwidth interface for die-to-die communication, wherein a first side of each logic die includes three physical interfaces and a second side of each logic die includes another three physical interfaces, and wherein twelve high-bandwidth memory stacks are arranged along the first side of the first and second logic dice, along the second side of the first and second logic dice, and along a third side of the second logic die, and wherein the twelve high-bandwidth memory stacks are connected to the physical interfaces of the first and second logic dice in a one-to-one correspondence.

15. The integrated circuit package of claim 5, wherein the one or more high-bandwidth memory stacks include first, second, third and fourth high-bandwidth memory stacks, and wherein the logic die includes first, second, third and fourth physical interfaces positioned on a first side of the logic die, wherein the first, second, third and fourth high-bandwidth memory stacks are connected to the first, second, third and fourth physical interfaces in a one-to-one correspondence.

16. The integrated circuit package of claim 15, wherein the one or more high-bandwidth memory stacks include fifth, sixth, seventh and eighth high-bandwidth memory stacks, and wherein the logic die includes fifth, sixth, seventh and eighth physical interfaces positioned on a second side of the logic die opposite the first side, wherein the fifth, sixth, seventh and eighth high-bandwidth memory stacks are connected to the fifth, sixth, seventh and eighth physical interfaces in a one-to-one correspondence.

17. The integrated circuit package of claim 15, wherein the first, second, third and fourth high-bandwidth memory stacks are arranged in a 2×2 array adjacent to the first side of the logic die.

18. The integrated circuit package of claim 17, wherein the first, second, third and fourth physical interfaces are aligned in pairs along a first axis of the logic die, and wherein the first, second, third and fourth high-bandwidth memory stacks are spaced apart from the logic die along the first axis.

19. The integrated circuit package of claim 15, wherein the plurality of printed traces connecting the first, second, third and fourth high-bandwidth memory stacks to the first, second, third and fourth physical interfaces are organic substrate traces.

20. A method of manufacturing an integrated circuit package, comprising:
  positioning a silicon interposer on a top surface of a substrate;
  positioning one or more logic dice on a top surface of the silicon interposer;
  positioning one or more high-bandwidth memory stacks on the substrate and spaced apart laterally from the silicon interposer;
  and
  forming a plurality of printed traces in the substrate, wherein the plurality of printed traces interface the one or more high-bandwidth memory stacks to the logic die.

* * * * *